(12) United States Patent
Mizushima

(10) Patent No.: US 9,570,541 B2
(45) Date of Patent: Feb. 14, 2017

(54) SEMICONDUCTOR DEVICE AND METHOD OF MANUFACTURING THE SAME

(75) Inventor: Tomonori Mizushima, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 356 days.

(21) Appl. No.: 13/994,424

(22) PCT Filed: Dec. 15, 2011

(86) PCT No.: PCT/JP2011/079042
§ 371 (c)(1),
(2), (4) Date: Jun. 14, 2013

(87) PCT Pub. No.: WO2012/081664
PCT Pub. Date: Jun. 21, 2012

(65) Prior Publication Data
US 2013/0264674 A1 Oct. 10, 2013

(30) Foreign Application Priority Data
Dec. 17, 2010 (JP) ................................. 2010-281132

(51) Int. Cl.
*H01L 29/06* (2006.01)
*H01L 29/08* (2006.01)
(Continued)

(52) U.S. Cl.
CPC ......... *H01L 29/0615* (2013.01); *H01L 21/221* (2013.01); *H01L 21/26506* (2013.01);
(Continued)

(58) Field of Classification Search
None
See application file for complete search history.

(56) References Cited

U.S. PATENT DOCUMENTS 4,004,950 A * 1/1977 Baruch ................... H01L 21/22
257/104
5,075,739 A * 12/1991 Davies .................. H01L 29/404
257/170
(Continued)

FOREIGN PATENT DOCUMENTS

JP H04-364079 A 12/1992
JP 2003-318412 A 11/2003
(Continued)

OTHER PUBLICATIONS

Narayanan et al., "Progress in MOS-controlled bipolar devices and edge termination technologies", Microelectronics Journal 35, pp. 235-248, 2004.
(Continued)

*Primary Examiner* — Ali Naraghi
(74) *Attorney, Agent, or Firm* — Rabin & Berdo, P.C.

(57) ABSTRACT

A semiconductor device is disclosed. In a surface layer of a front surface of an n-type semiconductor substrate, an anode layer is provided in an element activation portion and an annular p-type guard ring and an n-type high-concentration surface region are provided in an annular termination breakdown voltage region which surrounds the outer circumference of the anode layer. The impurity concentration of the n-type high-concentration surface region is higher than that of the semiconductor substrate and is lower than that of the p-type guard ring. The depth of the n-type high-concentration surface region is less than that of the guard ring. The anode layer and the guard ring are formed while the oxygen concentration of the semiconductor substrate is set to be equal to or more than $1\times10^{16}/cm^3$ and equal to or less than $1\times10^{18}/cm^3$.

12 Claims, 13 Drawing Sheets

(51) Int. Cl.
*H01L 29/36* (2006.01)
*H01L 29/66* (2006.01)
*H01L 29/739* (2006.01)
*H01L 21/22* (2006.01)
*H01L 21/265* (2006.01)
*H01L 21/324* (2006.01)
*H01L 29/32* (2006.01)
*H01L 29/861* (2006.01)

(52) U.S. Cl.
CPC ........ *H01L 21/324* (2013.01); *H01L 29/0619* (2013.01); *H01L 29/0834* (2013.01); *H01L 29/32* (2013.01); *H01L 29/36* (2013.01); *H01L 29/66128* (2013.01); *H01L 29/66333* (2013.01); *H01L 29/7395* (2013.01); *H01L 29/8611* (2013.01)

(56) References Cited

U.S. PATENT DOCUMENTS

| | | | |
|---|---|---|---|
| 6,762,097 B2* | 7/2004 | Takei | H01L 21/263 257/E21.383 |
| 2004/0041225 A1 | 3/2004 | Nemoto | |
| 2005/0179105 A1* | 8/2005 | Fujihira | H01L 29/0692 257/471 |
| 2006/0170075 A1* | 8/2006 | Takahashi | H01L 29/0619 257/580 |
| 2006/0278925 A1 | 12/2006 | Yamaguchi | |
| 2007/0108558 A1* | 5/2007 | Nemoto | H01L 29/36 257/655 |
| 2008/0315364 A1 | 12/2008 | Nemoto | |
| 2012/0267681 A1* | 10/2012 | Nemoto | H01L 21/263 257/139 |

FOREIGN PATENT DOCUMENTS

| | | |
|---|---|---|
| JP | 2006-332127 A | 12/2006 |
| JP | 2007-266520 A | 10/2007 |
| JP | 2008-091853 A | 4/2008 |
| JP | 2010-118440 A | 5/2010 |
| WO | WO-2007-055352 A1 | 5/2007 |

OTHER PUBLICATIONS

Clark et al., "High-Voltage Termination Using Enhanced Surface Doping", Proceedings of 1992 International Symposium on Power Semiconductor Devices & ICs, pp. 86-90.

Hazdra et al., "Thermal donor formation in silicon enhanced by high-energy helium irradiation", Nuclear Instruments and Methods in Physics Research B 253, pp. 187-191, 2006.

European search report issued on Apr. 23, 2015.

* cited by examiner

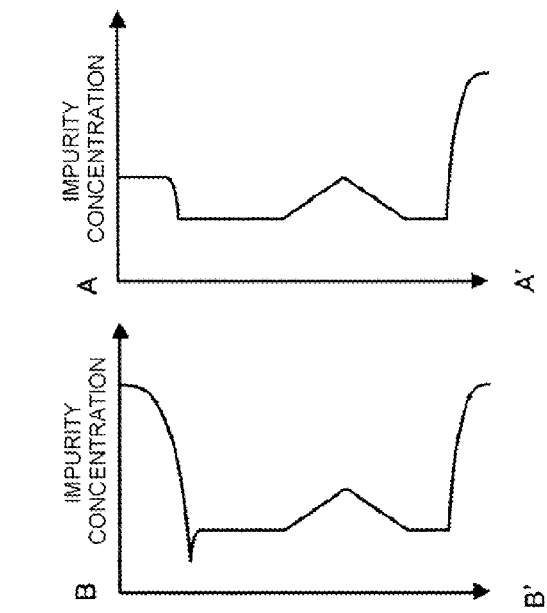
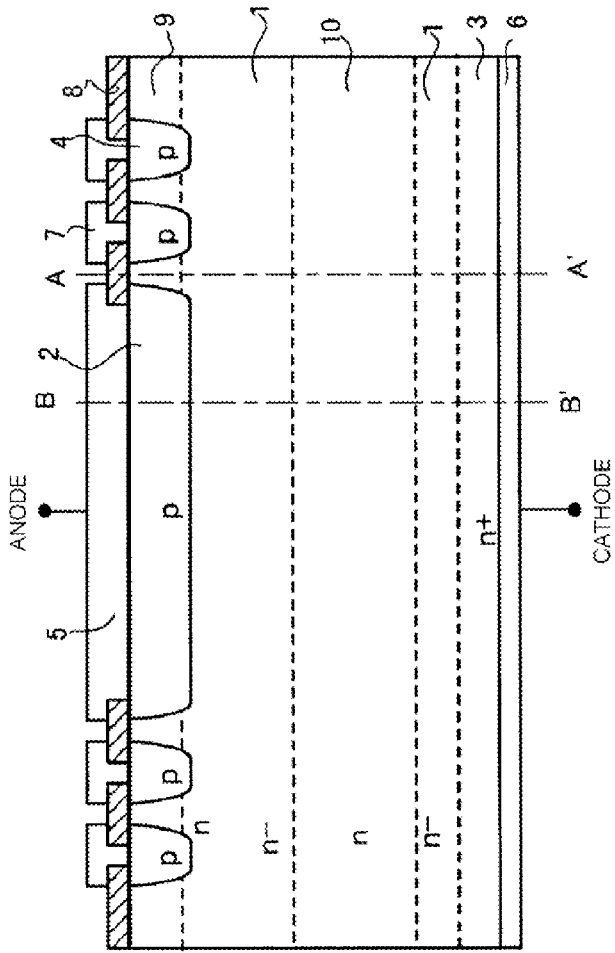
FIG. 1A  FIG. 1B  FIG. 1C

MAXIMUM CONCENTRATION OF n-TYPE HIGH-CONCENTRATION
SURFACE REGION/CONCENTRATION OF SUBSTRATE

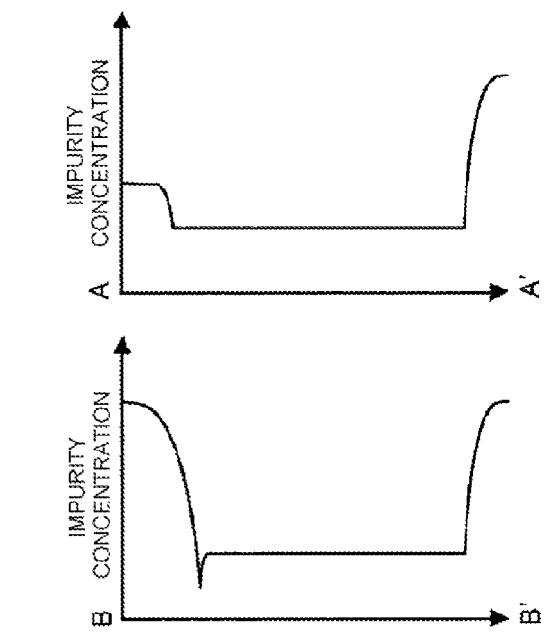
FIG. 4C
FIG. 4B
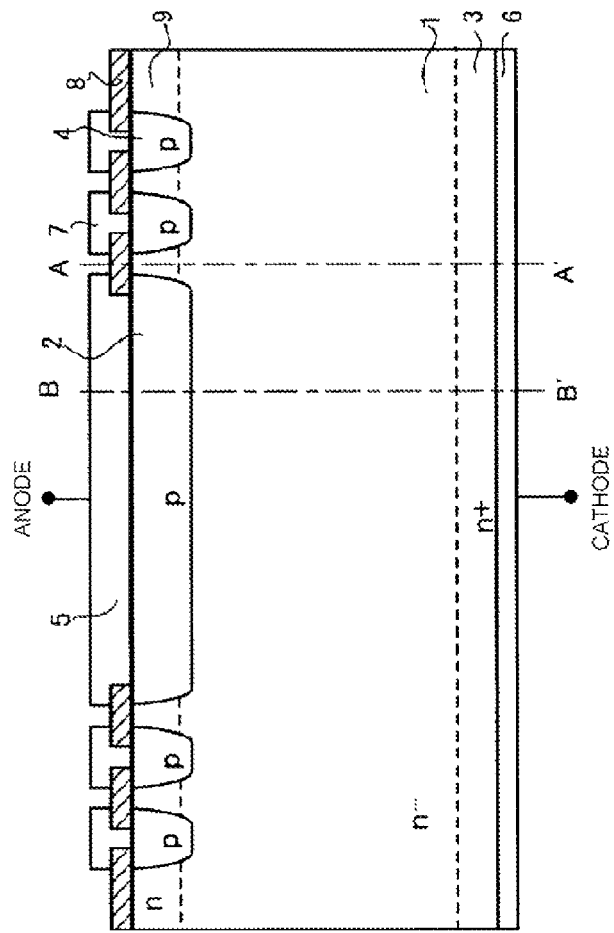
FIG. 4A

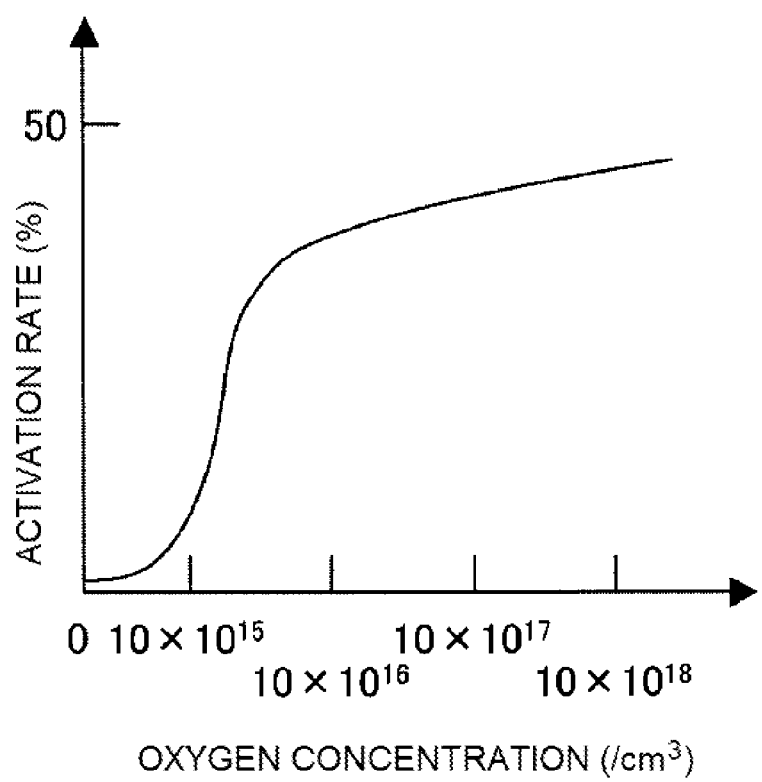

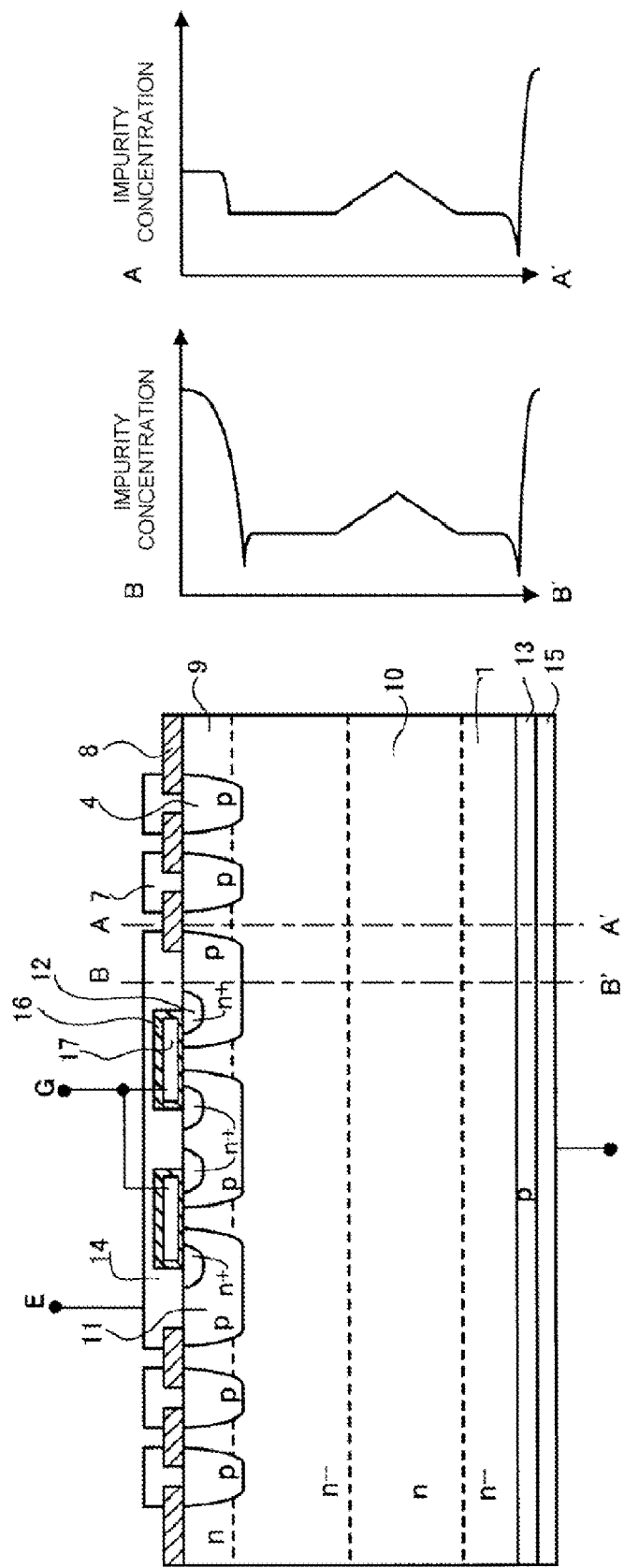

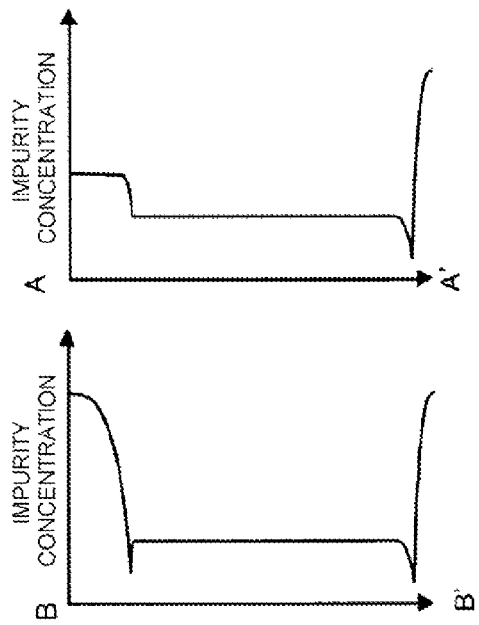
FIG. 9C
FIG. 9B
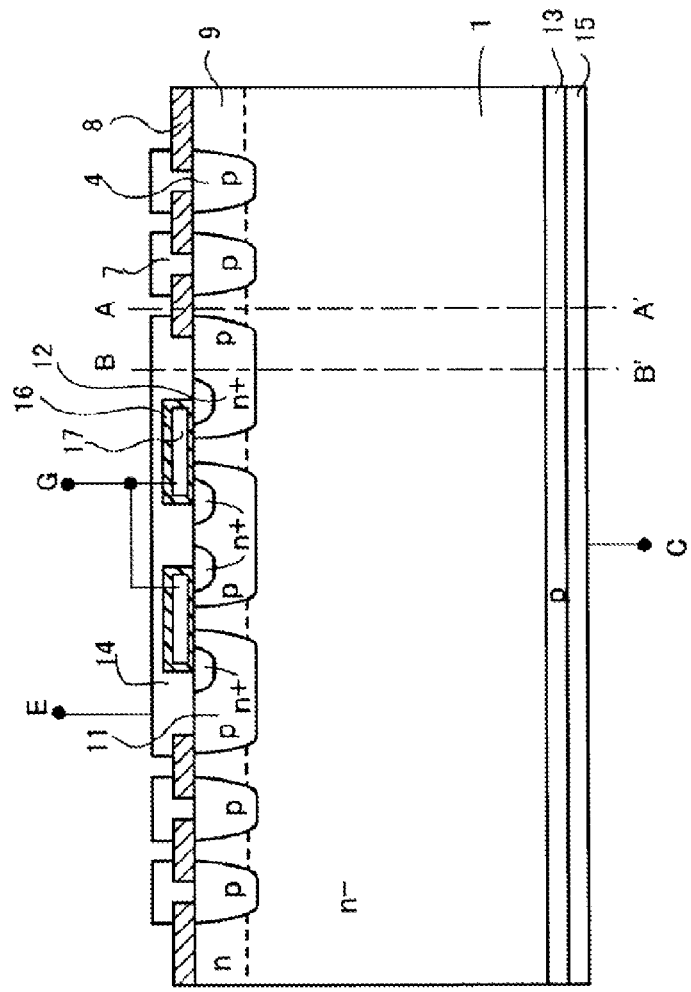
FIG. 9A

SEMICONDUCTOR DEVICE AND METHOD OF MANUFACTURING THE SAME

TECHNICAL FIELD

The present invention relates to a semiconductor device and a method of manufacturing the same.

BACKGROUND ART

Power semiconductor devices, such as converters and inverters, require low loss, low power consumption, a high speed, and high efficiency. For example, a power diode or a power IGBT (insulated gate bipolar transistor) with a breakdown voltage of 600 V, or 1200 V or more is used as the power semiconductor device. Therefore, a power diode or a power IGBT which has low loss characteristics when it is turned on or switched has been developed.

Next, the impurity concentration distribution of a device, such as a diode or an IGBT, according to the related art will be described. FIG. 11 is a diagram illustrating the uniform impurity concentration distribution of a general diode according to the related art. FIG. 12 is a diagram illustrating the impurity concentration distribution of a diode with a broad buffer structure according to the related art. FIG. 11(a) schematically illustrates the cross-sectional structure of the general diode. FIG. 12(a) schematically illustrates the cross-sectional structure of the diode with the broad buffer structure (hereinafter, referred to as a BB structure) according to the related art.

As an improvement in the device which has low loss characteristics when it is turned on or switched, a device, such as a power diode or a diode or an IGBT with a BB structure in which a BB region 10 is provided in a drift layer 1 as illustrated in FIG. 12, has been proposed (for example, see the following Patent Document 1). The BB structure has an impurity concentration distribution in which impurity concentration is the maximum in the vicinity of the center of the n⁻ type drift layer 1 in a PIN (P-Intrinsic-N) diode or IGBT and is slowly reduced toward a p anode layer 2 and an n⁺ cathode layer 3.

The drift layer 1 of the diode with the BB structure illustrated in FIG. 12 is compared with the drift layer (hereinafter, referred to as a drift layer with uniform impurity concentration) 1 with a uniform impurity concentration distribution in the general diode according to the related art illustrated in FIG. 11. The diode illustrated in FIG. 11(a) is configured so as to have the same thickness and breakdown voltage as those in the diode with the BB structure illustrated in FIG. 12. FIG. 11(b) illustrates the impurity concentration distribution taken along the cut line B-B' of FIG. 11(a). FIG. 11(c) illustrates the impurity concentration distribution taken along the cut line A-A' of FIG. 11(a).

In FIG. 12(b), the impurity concentration distribution taken along the cut line B-B' of FIG. 12(a) is represented by a solid line. In FIG. 12(c), the impurity concentration distribution taken along the cut line A-A' of FIG. 12(a) is represented by a solid line. In FIGS. 12(b) and 12(c), the impurity concentration distribution of the drift layer 1 with uniform impurity concentration in the general diode is represented by a dotted line in order to clarify the difference between the impurity concentration distribution of the drift layer 1 in the diode with the BB structure and the impurity concentration distribution of the drift layer 1 with uniform impurity concentration in the general diode.

As one of the methods of forming the BB region in the drift layer of the device, a method has been proposed which forms the BB region in the drift layer of the device using irradiation with protons (hereinafter, referred to as H⁺) (for example, see the following Patent Document 2). In the method of forming the BB region disclosed in Patent Document 2, an FZ (Floating Zone) bulk wafer is irradiated with H⁺ and a heat treatment is performed to partially change the radiated H⁺ into donors, thereby forming the BB region 10 with a desired impurity concentration distribution illustrated in FIGS. 12(b) and 12(c) in the drift layer 1.

However, the diode or IGBT with the BB structure has the following problems. As illustrated in FIGS. 11 and 12, in the general diode and the diode with the BB structure which have the same breakdown voltage, when the impurity concentration of the drift layer 1 with uniform impurity concentration is compared with the impurity concentration of the drift layer 1 having the BB region 10 provided therein, the maximum value (hereinafter, referred to as maximum impurity concentration) of the impurity concentration of the drift layer 1 having the BB region 10 provided therein is more than the impurity concentration of the drift layer 1 of the general diode. The minimum value of the impurity concentration of the drift layer 1 having the BB region 10 provided therein is less than the impurity concentration of the drift layer 1 of the general diode.

As such, in the drift layer 1 of the diode with the BB structure, the impurity concentration of a surface portion of the semiconductor substrate is less than that in the drift layer 1 with uniform impurity concentration in the general diode which has the same breakdown voltage as the diode with the BB structure. Therefore, it is easy for a depletion layer to extend in a direction (hereinafter, referred to as a surface direction) parallel to the surface of the semiconductor substrate in the surface portion of the semiconductor substrate and it is necessary to increase the area of a termination breakdown voltage region. When the impurity concentration of the surface of the termination breakdown voltage region is low, the device is likely to be affected by external charge. Therefore, the reliability of the breakdown voltage is likely to be reduced. As a method of avoiding the problem of the reliability of the breakdown voltage being reduced, a diode has been proposed in which a surface portion of a termination breakdown voltage region has high impurity concentration (for example, see the following Patent Document 3).

CITATION LIST

Patent Document

Patent Document 1: JP 2003-318412 A
Patent Document 2: Domestic Re-publication of the Application No. 2007-055352
Patent Document 3: JP 2006-332127 A

DISCLOSURE OF THE INVENTION

Problem to be Solved by the Invention

However, as disclosed in Patent Document 3, in the diode with the BB structure, in order to increase the impurity concentration of the surface portion of the termination breakdown voltage region, it is necessary to perform a process of forming a dedicated mask for increasing the impurity concentration of the surface portion of the termination breakdown voltage region and a photolithography process to perform ion implantation and thermal diffusion for a portion of the surface of the termination breakdown voltage region. Therefore, the number of processes increases, which results in an increase in chip costs.

The problems caused by the low impurity concentration of the surface portion of the termination breakdown voltage region are not limited to the diode with the BB structure, but may also occur in, for example, the IGBT. The reason is that, in general, a high-resistance semiconductor substrate is used to increase the thickness of the drift layer with low impurity concentration according to a desired breakdown voltage, in order to increase the breakdown voltage of the device. Therefore, when the high-resistance semiconductor substrate (the semiconductor substrate with low impurity concentration) is used, the area of the termination breakdown voltage region increases and the area of the element activation portion is relatively reduced. The reliability of the breakdown voltage is likely to be reduced.

Therefore, a semiconductor substrate with low resistance (high impurity concentration) is used as much as possible in terms of the reliability of the breakdown voltage. There is the trade-off relationship among the ensuring of the reliability of the breakdown voltage, the maintenance of the number of manufacturing processes, and a reduction in chip costs and it is difficult to remove the trade-off.

An object of the invention is to provide a semiconductor device capable of controlling a lifetime without adding a manufacturing process and a method of manufacturing the same, in order to solve the problems of the related art. Another object of the invention is to provide a semiconductor device capable of preventing an increase in the area ratio of a termination breakdown voltage region and a method of manufacturing the same, in order to solve the problems of the related art. Still another object of the invention is to provide a semiconductor device which can be manufactured at a low cost and improve the reliability of a breakdown voltage and a method of manufacturing the same, in order to solve the problems of the related art.

Means for Solving Problem

In order to solve the problems and achieve the objects of the invention, a semiconductor device according to an aspect of the invention has the following characteristics. In an active portion in which a main current flows, a p-type semiconductor region is selectively formed in a surface layer of one main surface of a n-type semiconductor substrate. In an annular termination breakdown voltage region which surrounds the outer circumference of the p-type semiconductor region, an annular p-type breakdown voltage structure region, such as a guard ring, is selectively formed in the surface layer of the one main surface of the semiconductor substrate. In the termination breakdown voltage region, an n-type high-concentration surface region that occupies a region of the surface layer of the one main surface of the semiconductor substrate other than a region in which the annular p-type breakdown voltage structure region is formed. The impurity concentration of the n-type high-concentration surface region is higher than the impurity concentration of the semiconductor substrate and is lower than the impurity concentration of the p-type breakdown voltage structure region. The depth of the n-type high-concentration surface region is less than the depth of the p-type breakdown voltage structure region.

In the semiconductor device according to the above-mentioned aspect of the invention, the impurity concentration of the n-type high-concentration surface region may be equal to or more than 1.5 times the impurity concentration of the semiconductor substrate and may be equal to or less than 4.5 times the impurity concentration of the semiconductor substrate.

The semiconductor device according to the above-mentioned aspect of the invention may further include an n-type broad buffer region that is provided in the semiconductor substrate, has impurity concentration higher than the semiconductor substrate, and has a sloped impurity concentration distribution in which impurity concentration is reduced from a portion with maximum impurity concentration in a depth direction of the semiconductor substrate to both main surfaces of the semiconductor substrate.

In the semiconductor device according to the above-mentioned aspect of the invention, the thickness of the n-type high-concentration surface region may be equal to or less than 6 µm.

The semiconductor device according to the above-mentioned aspect of the invention may be a diode or an IGBT.

According to another aspect of the invention, a method of manufacturing the semiconductor device has the following characteristics. A heat treatment is performed at a temperature of 1100° C. to 1350° C. in an oxygen atmosphere for 5 hours to 100 hours and impurity ion implantation and thermal diffusion are performed to form the p-type semiconductor region and the annular termination breakdown voltage region which surrounds the outer circumference of the p-type semiconductor region in the surface layer of the n-type semiconductor substrate. In addition, the oxygen concentration of the semiconductor substrate is set to be equal to or more than $1 \times 10^{16}/cm^3$ and equal to or less than $1 \times 10^{18}/cm^3$. Then, the surface of the semiconductor substrate in which the p-type semiconductor region is formed is irradiated with particle beams, which are one of helium ions, neon ions, argon ions, electron beams, and platinum ions, to form the n-type high-concentration surface region.

According to still another aspect of the invention, a method of manufacturing the semiconductor device has the following characteristics. A heat treatment is performed at a temperature of 1100° C. to 1350° C. in an oxygen atmosphere for 5 hours to 100 hours and impurity ion implantation and thermal diffusion are performed to form the p-type semiconductor region and the annular termination breakdown voltage region which surrounds the outer circumference of the p-type semiconductor region in the surface layer of the semiconductor substrate. In addition, the oxygen concentration of the semiconductor substrate is set to be equal to or more than $1 \times 10^{16}/cm^3$ and equal to or less than $1 \times 10^{18}/cm^3$. Then, the surface of the semiconductor substrate in which the p-type semiconductor region is formed is irradiated with protons with a dose equal to or more than $1 \times 10^{11}/cm^2$ and equal to or less than $1 \times 10^{14}/cm^2$ at an acceleration energy equal to or more than 1.0 MeV and equal to or less than 20.0 MeV to form the n-type broad buffer region and the n-type high-concentration surface region.

The method of manufacturing the semiconductor device according to the above-mentioned aspect of the invention has the following characteristics. The n-type broad buffer region and the n-type high-concentration surface region may be formed such that, in a section corresponding to a distance (range) Rp from the surface of the p-type semiconductor region to one of the portions with the maximum impurity concentration in the n-type broad buffer region, the thickness of a region with an oxygen concentration equal to or more than $1 \times 10^{16}/cm^3$ and equal to or less than $1 \times 10^{18}/cm^3$ in the semiconductor substrate is equal to or more than half the thickness of the section and the oxygen concentration of one of the portions with the maximum impurity concentration in the n-type broad buffer region is equal to or more than $1 \times 10^{16}/cm^3$ and equal to or less than $1 \times 10^{18}/cm^3$.

According to the invention, it is possible to form the n-type high-concentration surface region using a heat treatment and irradiation with particle beams when a lifetime killer is formed. Therefore, it is possible to form the BB region with a simple method with a small number of processes. In addition, according to the invention, it is possible to increase the impurity concentration of the n-type high-concentration surface region which is formed to a depth of 6 μm from the surface of the termination breakdown voltage region to be higher than the impurity concentration of the semiconductor substrate, while reducing the impurity concentration of the semiconductor substrate. As a result, it is possible to improve resistance to external charge and the equipotential lines of the depletion layer which extends from the pn junction during reverse bias are densely arranged in the n-type high-concentration surface region and are prevented from being spread.

Effect of the Invention

According to the semiconductor device and the method of manufacturing the same of the invention, it is possible to control the lifetime, without adding a manufacturing process. In addition, according to the semiconductor device and the method of manufacturing the same of the invention, it is possible to prevent an increase in the area ratio of the termination breakdown voltage region. According to the semiconductor device and the method of manufacturing the same of the invention, it is possible to provide an inexpensive semiconductor device with high reliability of breakdown voltage.

BRIEF DESCRIPTION OF DRAWINGS

FIG. 1 is a diagram illustrating the cross-sectional structure and impurity concentration distribution of a diode according to Embodiment 1 of the invention;

FIG. 4 is a diagram illustrating the cross-sectional structure and impurity concentration distribution of another example of the diode according to Embodiment 1 of the invention;

FIG. 6 is a correlation diagram illustrating the relationship between oxygen concentration in the semiconductor substrate and the activation ratio of $H^+$ (the rate of changing $H^+$ into a donor);

FIG. 7 is a diagram illustrating the cross-sectional structure and impurity concentration distribution of an IGBT according to Embodiment 2 of the invention;

FIG. 9 is a diagram illustrating the cross-sectional structure and impurity concentration distribution of another example of the IGBT according to Embodiment 2 of the invention;

BEST MODES FOR CARRYING OUT THE INVENTION

Figure 2A:
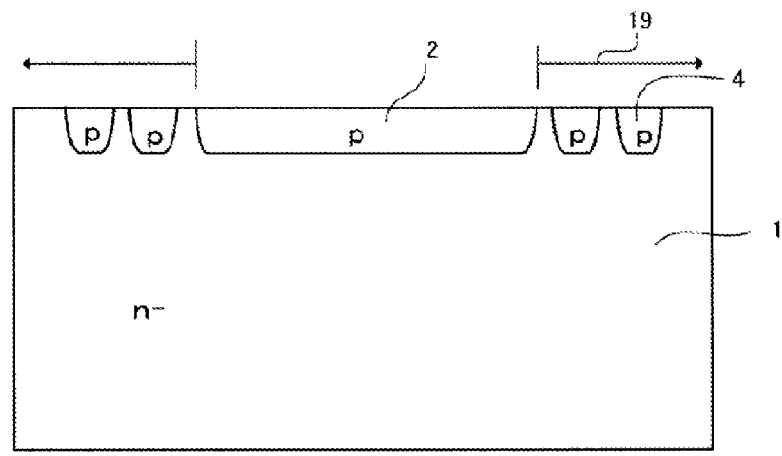
FIG. 2 is a cross-sectional view illustrating a main process of manufacturing the diode according to Embodiment 1 of the invention.

Hereinafter, a semiconductor device and a method of manufacturing the same according to exemplary embodiments of the invention will be described in detail with reference to the accompanying drawings. In the specification and the accompanying drawings, in the layers or regions having "n" or "p" appended thereto, an electron or a hole means a major carrier. In addition, symbols "+" and "−" added to n or p mean that impurity concentration is higher and lower than that of the layers without the symbols. In the description of the following embodiment and the accompanying drawings, the same components are denoted by the same reference numerals and the description thereof will not be repeated. In addition, the invention is not limited to the following embodiments as long as it does not depart from the scope and spirit thereof.

Embodiment 1

Hereinafter, a semiconductor device according to Embodiment 1 of the invention will be described. For example, a case in which the semiconductor device according to Embodiment 1 is a diode will be described. FIG. 1 is a diagram illustrating the cross-sectional structure and impurity concentration distribution of the diode according to Embodiment 1 of the invention. FIG. 1(a) schematically illustrates the cross-sectional structure of the diode according to Embodiment 1. FIG. 1(b) illustrates the impurity concentration distribution taken along the cut line B-B' of FIG. 1(a). FIG. 1(c) illustrates the impurity concentration distribution taken along the cut line A-A' of FIG. 1(a).

In the diode illustrated in FIG. 1(a), in an element activation portion in which a main current flows, an anode layer 2 is selectively provided in a surface layer of one main surface (hereinafter, referred to as a front surface) of a semiconductor substrate 1. In a breakdown voltage structure region which surrounds the anode layer 2, a p-type guard ring 4 is selectively provided in the surface layer of the front surface of the semiconductor substrate 1. An n-type high-concentration surface region 9 is provided in the surface layer of the front surface of the semiconductor substrate 1 so as to extend from the element activation portion to the breakdown voltage structure region. The n-type high-concentration surface region 9 includes a donor, which is a vacancy-oxygen complex defect formed by irradiation with $H^+$, at high concentration.

The depth of the n-type high-concentration surface region 9 is less than that of the anode layer 2 and the p-type guard ring 4. The impurity concentration of the n-type high-concentration surface region 9 is higher than that of the semiconductor substrate 1 and is lower than that of the anode layer 2. In the semiconductor substrate 1, an n-type broad buffer (BB) region 10 is provided at a position deeper than the node layer 2 and the guard ring 4 from the front surface of the semiconductor substrate 1 so as to extend from the element activation portion to the breakdown voltage structure region. The BB region 10 may come into contact with the n-type high-concentration surface region 9 or it may be separated from the n-type high-concentration surface region 9.

A portion of the front surface of the semiconductor substrate 1 in which the anode layer 2 and the guard ring 4 are not provided is covered with an insulating film 8 such as a silicon oxide film. An anode electrode 5 comes into contact with the anode layer 2. A guard ring electrode 7 comes into contact with the guard ring 4. The anode electrode 5 and the guard ring electrode 7 are insulated from each other by the insulating film 8. A cathode layer 3 is provided in the other main surface (a main surface opposite to the main surface in which the anode layer 2 is formed; hereinafter, referred to as a rear surface) of the semiconductor substrate 1 so as to be separated from the BB region 10. A cathode electrode 6 comes into contact with the cathode layer 3.

Next, a method of manufacturing the diode according to Embodiment 1 of the invention illustrated in FIG. 1(a) will be described with reference to FIG. 2. FIG. 2 is a cross-sectional view illustrating a main process of manufacturing the diode according to Embodiment 1 of the invention. First, the high-resistance n-type silicon semiconductor substrate (hereinafter, simply referred to as a semiconductor substrate) 1 which is manufactured by an FZ method is prepared. Then, thermal oxidation is performed by a heat treatment in an oxygen atmosphere and a photolithography process is performed to form a resist mask in which predetermined portions are opened on one main surface (hereinafter, referred to as the front surface) of the semiconductor substrate 1. Then, ion implantation is performed using the resist mask as a mask to introduce p-type impurities, such as boron, into the opening portions of the resist mask from the front surface of the semiconductor substrate 1.

Figure 2B:
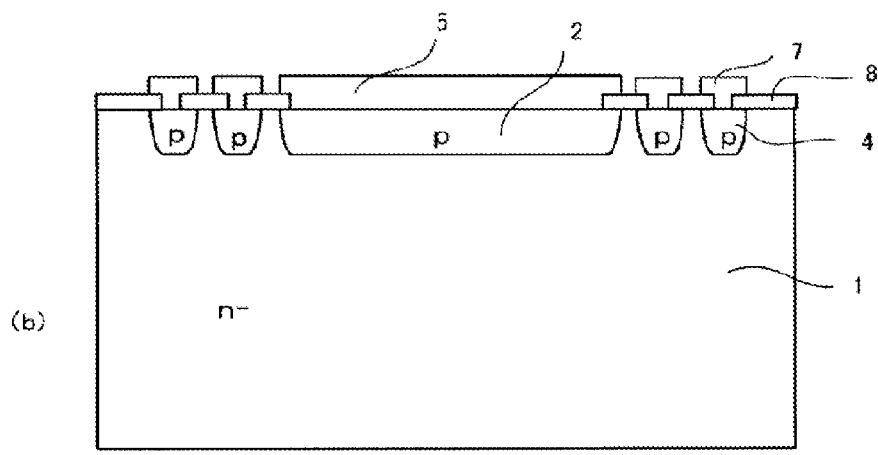
Figure 2C:
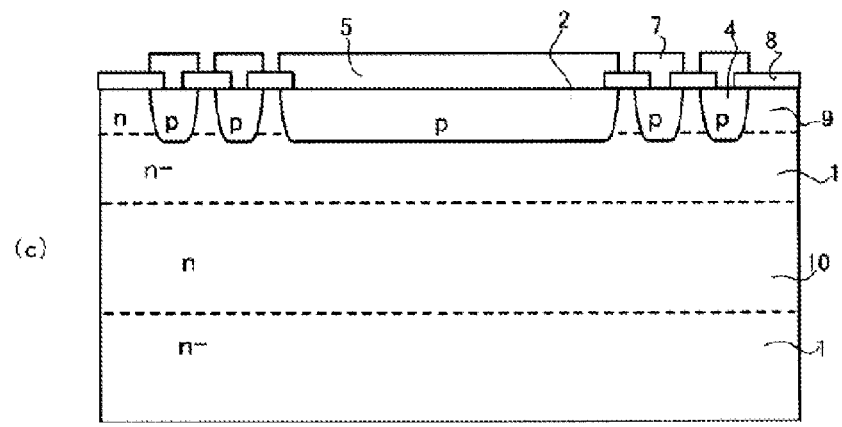

Then, a thermal diffusion process is performed in an atmosphere including oxygen for the period for which the temperature is increased or decreased or the temperature is constant to selectively form the anode layer 2 in the element activation portion in which the main current flows and to selectively form the p-type guard ring 4 in a breakdown voltage structure region 19 surrounding the anode layer 2 (FIG. 2(a)). In this stage, oxygen is introduced and distributed at an impurity concentration equal to or more than $1 \times 10^{16}/cm^3$ and equal to or less than $1 \times 10^{18}/cm^3$ in the surface layer of the semiconductor substrate 1 by the heat treatment in the oxygen atmosphere.

Then, thermal oxidation or film growth is performed to form the insulating film 8 which covers a portion of the front surface of the semiconductor substrate 1 in which the anode layer 2 and the guard ring 4 are not provided. Then, the anode electrode 5 and the guard ring electrode 7 which come into conductive contact with the surfaces of the anode layer 2 and the guard ring 4 are formed by, for example, vapor deposition or sputtering (FIG. 2(b)). Then, proton ($H^+$) is radiated to the same main surface of the semiconductor substrate 1 as that (front surface) for which ion implantation for forming the anode layer 2 is performed, thereby performing a heat treatment.

The n-type high-concentration surface region 9 including a donor, which is a vacancy-oxygen complex defect, at high concentration is formed in the surface layer which is shallower than the anode layer 2 and the guard ring 4 from the front surface of the semiconductor substrate 1 by irradiation with $H^+$. Furthermore, in addition to the n-type high-concentration surface region 9, the BB region 10 is formed at a position deeper than the anode layer 2 and the guard ring 4 from the front surface of the semiconductor substrate 1 by irradiation with $H^+$ (FIG. 2(c)). The n-type high-concentration surface region 9 and the BB region 10 may overlap each other in the depth direction of the semiconductor substrate 1 or they may be separated from each other in the depth direction.

When the n-type high-concentration surface region 9 is formed by particle beams other than $H^+$, particle beams, such as helium (He) ions, neon (Ne) ions, argon (Ar) ions, electron beams, or platinum (Pt) ions, may be radiated, instead of $H^+$. A range Rp when each particle beam is radiated (implanted) to silicon is as follows at an acceleration energy of 200 keV to 30 MeV. The range Rp is an average distance to the position where the particle beam is completely stopped in the semiconductor substrate 1 when the particle beam is radiated to the semiconductor substrate 1. The range Rp of $H^+$ may be, for example, from 1.8 μm to 4910 μm. The range Rp of the helium ion may be, for example, from 1.1 μm to 432.7 μm. The range Rp of the neon ion may be, for example, from 0.4 μm to 16.0 μm. The range Rp of the argon ion may be, for example, from 0.2 μm to 9.8 μm.

The range Rp of the platinum (Pt) ion may be, for example, from 0.07 μm to 13.5 μm at an acceleration energy of 200 keV to 100 MeV. The range Rp of the electron beam may be, for example, from 80 μm to 20 mm at an acceleration energy of 100 keV to 10 MeV. The dose and acceleration energy of each particle beam are as follows. For $H^+$, for example, a dose may be in the range of $1 \times 10^{11}/cm^2$ to $1 \times 10^{14}/cm^2$ and acceleration energy may be in the range of, about, 1.0 MeV to 20 MeV.

For He, for example, a dose may be in the range of $1 \times 10^{11}/cm^2$ to $1 \times 10^{14}/cm^2$ and acceleration energy is in the range of about 1.0 MeV to 30 MeV. When the electron beam is used, it is preferable that acceleration energy be in the range of 1.0 MeV to 10 MeV and a dose be in the range of about 10 kGy to 600 kGy. In this case, the range Rp of the electron beam is sufficiently wide and the n-type high-concentration surface region 9 can be formed in the surface layer of the front surface of the semiconductor substrate 1. For the Ar ion, the Ne ion, and the Pt ion, it is preferable that a dose be in the range of $1 \times 10^{11}/cm^2$ to $1 \times 10^{14}/cm^2$ at the above-mentioned range of the acceleration energy.

The reason why the dose is set in the above-mentioned range is as follows. When the dose is less than the above-mentioned range, the number of complex defects is too small and it is difficult to obtain a valid effect. When the dose is more than the above-mentioned range, the number of complex defects is too large and mobility is reduced. As a result, it is difficult to obtain a desired forward voltage Vf. Therefore, acceleration energy is set in the above-mentioned range in order to set the range Rp to a desired depth in the semiconductor substrate 1 made of a silicon semiconductor.

The acceleration energy of $H^+$ is set in the above-mentioned range in order to set the half width of the BB region 10 to a desired thickness. In addition, it is more preferable that the acceleration energy of $H^+$ be in the range of 1.0 MeV to 8.0 MeV and the dose of $H^+$ be in the range of $1 \times 10^{12}/cm^2$ to $1 \times 10^{13}/cm^2$. The reason is that it is possible to form the BB region 10 in which the width is about the standard deviation ($\Delta Rp$) (1 μm to 25 μm) of implantation and the effective dose of donors which are electrically activated is in the range of $2 \times 10^{11}/cm^2$ to $1 \times 10^{12}/cm^2$.

Then, the rear surface of the semiconductor substrate 1 is polished to a predetermined thickness, which is not illustrated in the drawings. Then, n-type impurities, such as phosphorus, are introduced from the rear surface of the semiconductor substrate 1 by ion implantation and the cathode layer 3 is formed on the rear surface of the semiconductor substrate 1 by a thermal diffusion process. Then, the surface of the cathode layer 3 is covered with the cathode electrode 6. In this way, the diode illustrated in FIG. 1(a) is completed.

Figure 3:
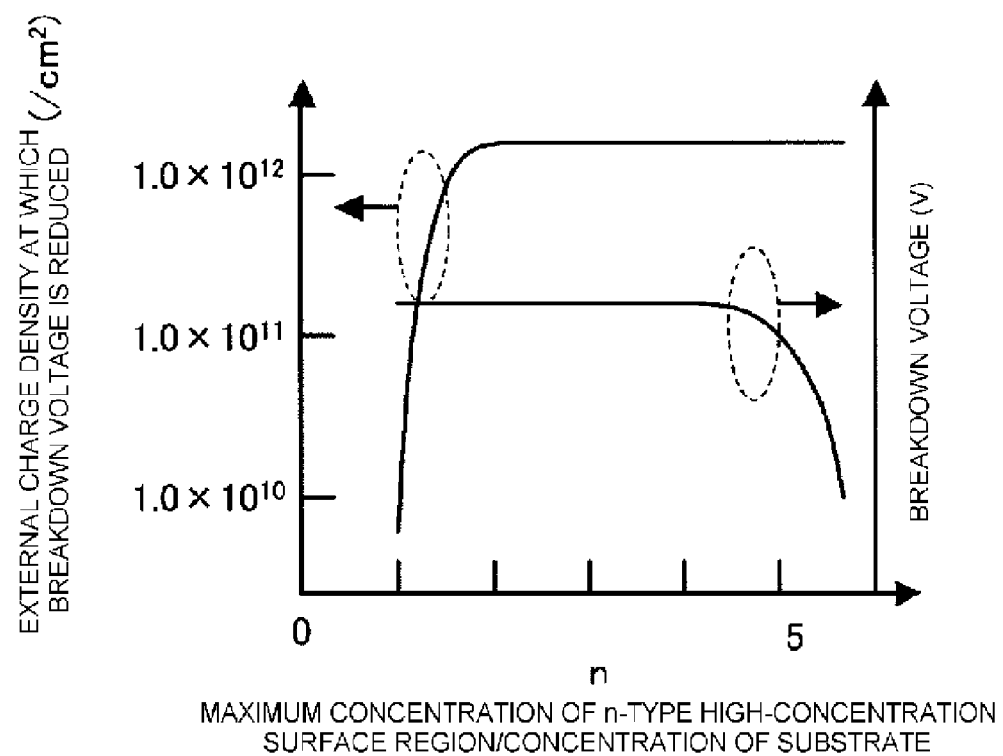
FIG. 3 is a correlation diagram illustrating the relationship between the impurity concentration of a semiconductor substrate and external charge density.

Next, the relationship between the ratio of the maximum value of the impurity concentration of the BB region 10 to the impurity concentration of the semiconductor substrate 1 in the semiconductor device illustrated in FIG. 1 and external charge density will be described. FIG. 3 is a correlation diagram illustrating the relationship between the impurity concentration of the semiconductor substrate and the external charge density. FIG. 3 illustrates the ratio of the maximum impurity concentration of the n-type high-concentration surface region 9 to the original impurity concentration of the semiconductor substrate 1, external charge concentration (density) at which a reverse breakdown voltage starts to be reduced, and the reverse breakdown voltage. The original impurity concentration of the semiconductor substrate 1 means the impurity concentration of the semiconductor substrate 1 before the n-type high-concentration surface region 9 and the BB region 10 are formed in the semiconductor substrate 1.

As can be seen from the correlation diagram illustrated in FIG. 3, in the layer structure of the diode illustrated in FIG. 1, when the impurity concentration of the n-type high-concentration surface region 9 is about 1.5 times to 4.5 times the impurity concentration of the semiconductor substrate 1, the breakdown voltage is not reduced even though the external charge density is high, for example, $1\times10^{12}/cm^2$ and a diode with high reliability and high resistance to external charge is obtained. On the other hand, when the impurity concentration of the n-type high-concentration surface region 9 is significantly higher than the impurity concentration of the semiconductor substrate 1, for example, when the impurity concentration of the n-type high-concentration surface region 9 is equal to or greater than 4.5 times the impurity concentration of the semiconductor substrate 1, surface impurity concentration between the guard rings 4 is too high and it is difficult for a depletion layer to extend. As a result, the intensity of the electric field increases and the breakdown voltage is reduced. In addition, as can be seen from the correlation diagram illustrated in FIG. 3, it is more preferable that the impurity concentration of the n-type high-concentration surface region 9 be 2.0 times to 4.0 times the impurity concentration of the semiconductor substrate 1. In this case, the breakdown voltage does not vary depending on the external charge density and it is possible to stably maintain the breakdown voltage.

A method of forming the n-type high-concentration surface region 9 is not limited to irradiation with H. The n-type high-concentration surface region 9 may be formed by complex defects which are formed by the above-mentioned other particle beams such as He or electron beams. In this case, it is possible to obtain the same effect as described above. FIG. 4 is a cross-sectional view illustrating a diode including the n-type high-concentration surface region 9 which is formed by particle beams other than H$^+$ and an impurity concentration distribution diagram. FIG. 4 is a diagram illustrating the cross-sectional structure and impurity concentration distribution of another example of the diode according to Embodiment 1 of the invention. FIG. 4(a) illustrates the diode which does not include the BB region 10 provided in a drift layer, which is the semiconductor substrate 1, and includes the n-type high-concentration surface region 9. FIG. 4(b) illustrates the impurity concentration distribution taken along the cut line B-B' of FIG. 4(a). FIG. 4(c) illustrates the impurity concentration distribution taken along the cut line A-A' of FIG. 4(a). The diode illustrated in FIG. 4 differs from the diode illustrated in FIG. 1 in that it does not include the BB region 10.

Figure 5:
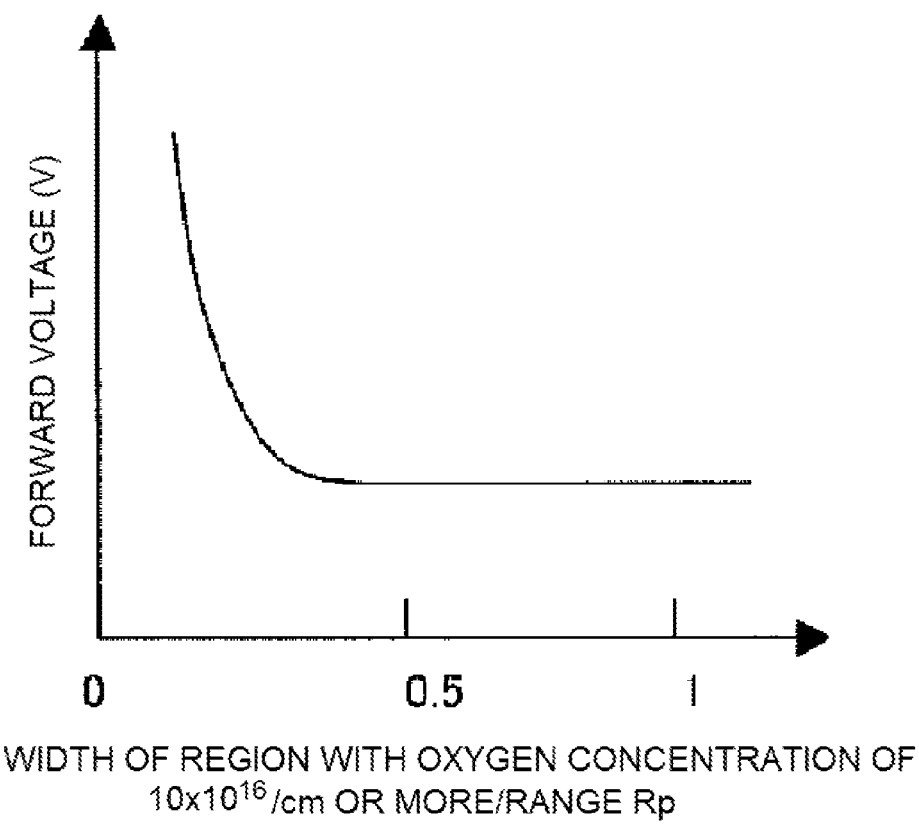
FIG. 5 is a correlation diagram illustrating the relationship between oxygen concentration in the semiconductor substrate and a forward voltage of the diode.

In this case, attention needs to be paid to the formation of the n-type high-concentration surface region 9 by H$^+$ irradiation. That is, as disclosed in Patent Document 1, when oxygen concentration in the semiconductor substrate 1 is too low, for example, when oxygen concentration is equal to or less than $1\times10^{16}/cm^3$, the influence of a reduction in mobility during irradiation with H$^+$ is more than the influence of an increase in the number of donors, which are vacancy-oxygen complex defects caused by irradiation with H$^+$, and the forward characteristics deteriorate. The deterioration of the forward characteristics will be described with reference to FIG. 5. FIG. 5 is a correlation diagram illustrating the relationship between oxygen concentration in the semiconductor substrate and the forward voltage of the diode. FIG. 5 illustrates the relationship between the ratio of the depth (width) of a region with an oxygen concentration of $1\times10^{16}/cm^3$ or more from the surface of the semiconductor substrate 1 to the range Rp of a proton and the forward voltage of the diode. As illustrated in the correlation diagram of FIG. 5, when the thickness of a region with an oxygen concentration of more than $1\times10^{16}/cm^3$ is equal to or less than half the thickness of a region in the range Rp from the surface of the semiconductor substrate 1, that is, when the thickness of a region with an oxygen concentration of less than $1\times10^{16}/cm^3$ is equal to or more than half the thickness of the region in the range Rp, the forward voltage is significantly increased by a reduction in mobility.

It is preferable to increase the rate of changing H$^+$ into a donor in order to effectively form the BB region 10 using irradiation with H$^+$. FIG. 6 is a correlation diagram illustrating the relationship between oxygen concentration in the semiconductor substrate and the activation (the rate of changing H$^+$ into a donor) of H$^+$. As can be seen from FIG. 6, the rate of changing H$^+$ into a donor is significantly improved when the oxygen concentration in the semiconductor substrate 1 is equal to or more than $1\times10^{16}/cm^3$. On the other hand, when the oxygen concentration in the semiconductor substrate 1 is less than $1\times10^{16}/cm^3$, the rate of changing H$^+$ into a donor is rapidly reduced. When the rate is equal to or less than 10%, it is difficult to effectively form the BB region 10. Therefore, it is difficult to obtain the oscillation prevention effect of the BB region 10. When the dose of H$^+$ increases to forcibly form the BB region 10, a lifetime is significantly reduced due to irradiation with an excessively large amount of H$^+$, a leakage current increases, or mobility is reduced. As a result, Err-Vf (reverse recovery loss-forward voltage drop) trade-off deteriorates.

As described above, it is preferable that the oxygen concentration in the semiconductor substrate 1 be high, for example, equal to or more than $1\times10^{16}/cm^3$. However, when the oxygen concentration in the semiconductor substrate 1 is too high, for example, equal to or more than $1\times10^{18}/cm^3$, an OSF fault (Oxidation-induced Stacking Fault) is noticeable in the semiconductor substrate 1 and the leakage current increases, which is not preferable.

Therefore, it is preferable that, in the semiconductor substrate 1, particularly, in a section corresponding to the range Rp from the surface of the anode layer 2 to the position of the maximum impurity concentration of the BB region 10 with the thickness of a region with an oxygen concentration equal to or more than $1 \times 10^{16}/cm^3$ and equal to or less than $1 \times 10^{18}/cm^3$ in the semiconductor substrate 1 be equal to or more than half the thickness of the section and oxygen concentration at the position of the maximum value of the impurity concentration of the broad buffer region (BB region) 10 be equal to or more than $1 \times 10^{16}/cm^3$ and equal to or less than $1 \times 10^{18}/cm^3$. Even when H⁺ is radiated a plurality of times to form a plurality of BB regions 10, it is preferable that the oxygen concentration of at least one of the portions with the maximum impurity concentration (maximum value) in the plurality of BB regions 10 be equal to or more than $1 \times 10^{16}/cm^3$ and equal to or less than $1 \times 10^{18}/cm^3$.

In addition, there is a method in which oxygen is introduced into the surface of the semiconductor substrate 1 in advance by an ion implantation method or a thermal diffusion method. For example, oxygen ions are implanted into the mirrored surface of the n-type semiconductor substrate 1 manufactured by the FZ method with a dose equal to or more than $1 \times 10^{12}/cm^2$ and equal to or less than $1 \times 10^{16}/cm^2$ at an acceleration energy of 100 keV to 10 MeV. Then, a heat treatment is performed at a temperature of about 1100° C. to 1350° C. in an oxygen atmosphere for 10 hours to 100 hours. In this way, a region with an oxygen concentration equal to or more than $1 \times 10^{16}/cm^3$ and equal to or less than $1 \times 10^{18}/cm^3$ can be formed in the semiconductor substrate 1.

Alternatively, oxygen ions are not implanted, and a heat treatment is performed at a temperature of about 1100° C. to 1350° C., preferably, 1200° C. to 1350° C. in an oxygen atmosphere for 5 hours to 100 hours (preferably 10 hours to 100 hours) while an oxide film is formed. In this way, it is possible to introduce oxygen into the semiconductor substrate at the same concentration as that when a region including oxygen is formed in the semiconductor substrate 1 by ion implantation. Alternatively, a thermally-oxidized film with a thickness of about 1 µm may be formed in advance in an oxygen atmosphere by, for example, a known pyrogenic oxidation method and a heat treatment may be performed at a temperature of 1100° C. to 1350° C. in an oxygen atmosphere or a nitrogen atmosphere for 10 hours to 100 hours. When it is necessary to finely control the oxygen concentration distribution of the semiconductor substrate 1, the heat treatment may be performed in combination with the former ion implantation method. In addition, the implantation of oxygen ions may be avoided in order to prevent damage to the surface of the semiconductor substrate 1 due to the implantation of oxygen ions.

Figure 13:
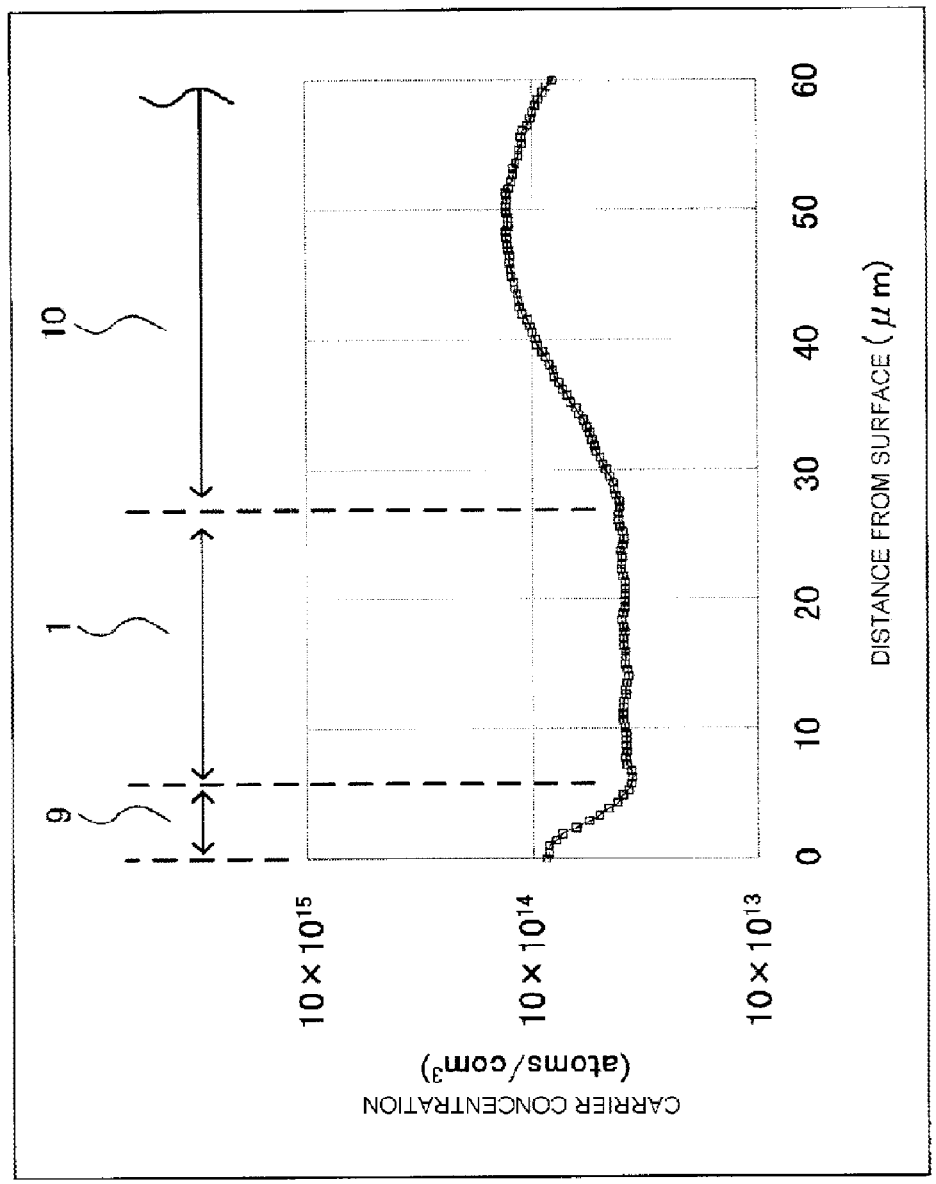
FIG. 13 is a characteristic diagram illustrating the net doping concentration distribution of a semiconductor device according to the invention.

Next, a net doping concentration distribution in the semiconductor substrate 1 will be described. FIG. 13 is a characteristic diagram illustrating the net doping concentration distribution of the semiconductor device according to the invention. FIG. 13 illustrates the result obtained by measuring net doping concentration using a known spreading resistance profiling method when oxygen is introduced into the semiconductor substrate 1 at a temperature of 1300° C. in an oxygen atmosphere for 15 hours while an oxide film is formed on the surface of the semiconductor substrate 1, the surface of the semiconductor substrate 1 irradiated with H⁺ with a dose of $2 \times 10^{12}/cm^2$ at an acceleration energy of 8 MeV, and a heat treatment is performed at a temperature of 350° C. In the measurement, SSM-2000 manufactured by Solid-State Measurement, Inc. was used.

The result illustrated in FIG. 13 proved that irradiation with H⁺ made it possible to form the BB region 10 at a depth greater than 30 µm from the surface. In addition, the n-type high-concentration surface region 9 with an impurity concentration higher than the impurity concentration (about $4 \times 10^{13}/cm^3$) of the drift layer, which was the semiconductor substrate 1, and a maximum concentration of about $9 \times 10^{13}/cm^3$ could be formed to a depth of 6 µm from the surface (0 µm) of the semiconductor substrate 1.

In this case, it was confirmed by a known secondary ion mass spectroscopy (SIMS) that oxygen could be introduced with a Gaussian distribution in which impurity concentration in the vicinity of the surface of the semiconductor substrate 1 was a maximum of about $3 \times 10^{17}/cm^3$. Since the rate of changing a vacancy-oxygen complex defect into a donor in a region through which particle beams pass is in the range of about 0.03% to 0.3%, the concentration of a portion (0 µm to 6 µm) with the maximum oxygen concentration is higher than that of the semiconductor substrate 1.

Oxygen is also introduced into the semiconductor substrate 1 in a process of introducing a general p-type anode layer 2 or a general guard ring 4 using ion implantation and thermal diffusion or a process of thermally oxidizing silicon to form a thermally-oxidized film with a thickness of 1 µm or less as the insulating layer, in addition to the process of introducing oxygen into the semiconductor substrate 1 in advance. In some cases, the n-type high-concentration surface region 9 according to the invention can be formed only by the thermal diffusion of, for example, the general p-type anode layer 2 or the formation of a thermally-oxidized film. However, the process of introducing oxygen into the semiconductor substrate 1 in advance is preferable in order to reliably introduce oxygen in the above concentration distribution.

As described above, according to the semiconductor device of Embodiment 1, it is possible to increase the impurity concentration of the n-type high-concentration surface region which is formed to a depth of 6 µm from the surface of a termination breakdown voltage region to be higher than the impurity concentration of the semiconductor substrate, while reducing the impurity concentration of the semiconductor substrate. As a result, it is possible to improve resistance to external charge and the equipotential lines of the depletion layer which extends from the pn junction during reverse bias are densely arranged in the n-type high-concentration surface region and are prevented from being spread. Therefore, it is possible to provide a semiconductor device which has high reliability and a small size and is capable of preventing an increase in the area ratio of the termination breakdown voltage region. In addition, since the defect caused by irradiation with particle beams can be used as a recombination center, it is possible to reduce the lifetime in the vicinity of the termination breakdown voltage region. In this way, it is possible to prevent the concentration of carriers on the termination breakdown voltage region when power is supplied and during reverse recovery. In the structure of the semiconductor device according to Embodiment 1, the n-type high-concentration surface region and the BB region (or only the n-type high-concentration surface region) can be formed by irradiation with particle beams and a heat treatment process when a lifetime killer is formed, and therefore, it is possible to form a semiconductor device using a simple method with a small number of processes. In this way, it is possible to provide an inexpensive semiconductor device. In addition, since the broad buffer region with high impurity concentration is provided in the drift layer, a diode with a high speed, low loss, and soft switching characteristics is obtained.

Embodiment 2

Next, a semiconductor device according to Embodiment 2 of the invention will be described. For example, a case in which the semiconductor device according to Embodiment 2 is an IGBT will be described. FIG. 7 is a diagram illustrating the cross-sectional structure and impurity concentration distribution of the IGBT according to Embodiment 2 of the invention. FIG. 7(a) schematically illustrates the cross-sectional structure of the IGBT according to Embodiment 2. FIG. 7(b) illustrates the impurity concentration distribution taken along the cut line B-B' of FIG. 7(a). FIG. 7(c) illustrates the impurity concentration distribution taken along the cut line A-A' of FIG. 7(a).

In the IGBT illustrated in FIG. 7(a), in an element activation portion in which a main current flows, a p-type base layer 11 is selectively provided in a surface layer of the front surface of a semiconductor substrate 1. An emitter layer 12 is selectively provided in the p-type base layer 11. In a breakdown voltage structure region which surrounds the element activation portion, a p-type guard ring 4 is selectively provided in the surface layer of the front surface of the semiconductor substrate 1. An n-type high-concentration surface region 9 is provided in the surface layer of the front surface of the semiconductor substrate 1 so as to extend from the element activation portion to the breakdown voltage structure region.

The depth of the n-type high-concentration surface region 9 is less than that of the p-type base layer 11 and the p-type guard ring 4. The impurity concentration of the n-type high-concentration surface region 9 is higher than that of the semiconductor substrate 1 and is lower than that of the p-type base layer 11. In the semiconductor substrate 1, an n-type BB region 10 is provided at a position deeper than the p-type base layer 11 and the guard ring 4 from the front surface of the semiconductor substrate 1 so as to extend from the element activation portion to the breakdown voltage structure region. The n-type high-concentration surface region 9 and the BB region 10 have the same structure as the n-type high-concentration surface region and the BB region according to Embodiment 1.

A portion of the front surface of the semiconductor substrate 1 in which the p-type base layer 11 and the guard ring 4 are not provided is covered with an insulating film 8 such as a silicon oxide film. An emitter electrode 14 comes into contact with the p-type base layer 11 and an emitter layer 12. A guard ring electrode 7 comes into contact with the guard ring 4. The emitter electrode 14 and the guard ring electrode 7 are insulated from each other by the insulating film 8. A collector layer 13 is provided on the rear surface (a main surface opposite to the main surface in which the p-type base layer 11 is formed) of the semiconductor substrate 1 so as to be separated from the BB region 10. A collector electrode 15 comes into contact with the collector layer 13.

Figure 8A:
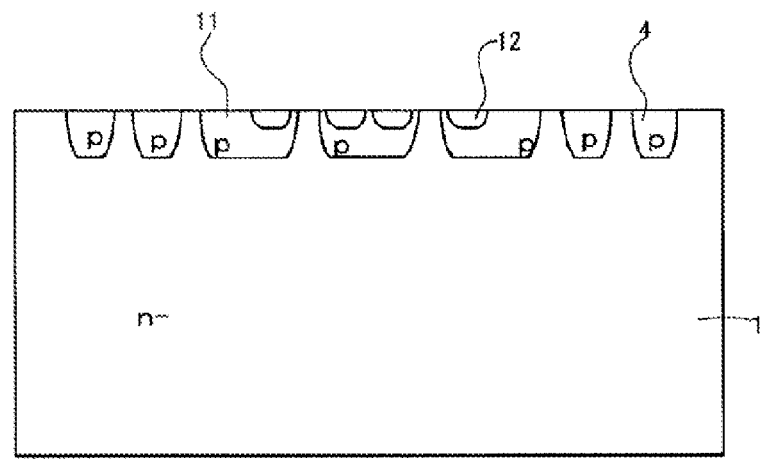
FIG. 8 is a cross-sectional view illustrating a main process of manufacturing the IGBT according to Embodiment 2 of the invention.
Figure 8B:
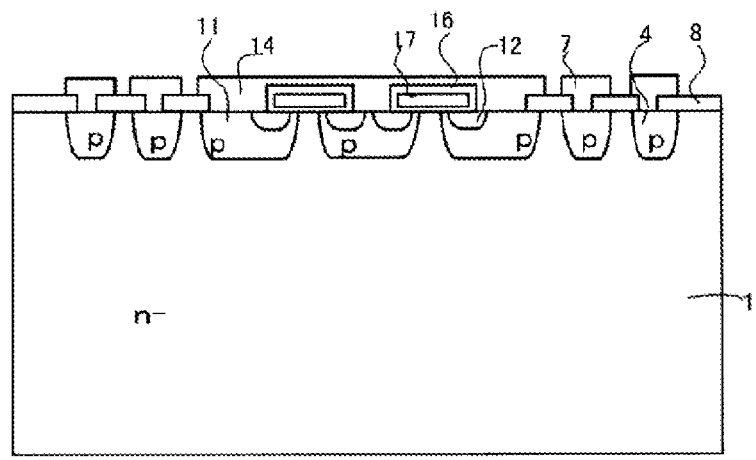

A method of manufacturing the IGBT according to Embodiment 2 of the invention illustrated in FIG. 7(a) will be described with reference to FIG. 8. FIG. 8 is a cross-sectional view illustrating a main process of manufacturing the IGBT according to Embodiment 2 of the invention. First, the n-type semiconductor substrate 1 with high resistance which is manufactured by an FZ method is prepared. Then, the p-type base layer 11, the emitter layer 12, and the guard ring 4 are selectively formed in the surface layer of the front surface of the semiconductor substrate 1 by ion implantation and thermal diffusion (FIG. 8(a)). Then, a MOS gate structure including, for example, a gate insulating film and a gate electrode 17 is formed on the surface of the p-type base layer 11 interposed between the emitter layer 12 and the surface layer of the semiconductor substrate 1.

Then, the insulating film 8 which covers a portion of the front surface of the semiconductor substrate 1 in which the p-type base layer 11 and the guard ring 4 are not provided is formed on the surface of the guard ring 4 by thermal oxidation or film growth. Then, the emitter electrode 14 which comes into contact with the p-type base layer 11 and the emitter layer 12 and covers the gate electrode 17 with an interlayer insulating film 16 interposed therebetween and the guard ring electrode 7 which comes into contact with the guard ring 4 are formed by, for example, vapor deposition or sputtering (FIG. 8(b)).

Figure 8C:
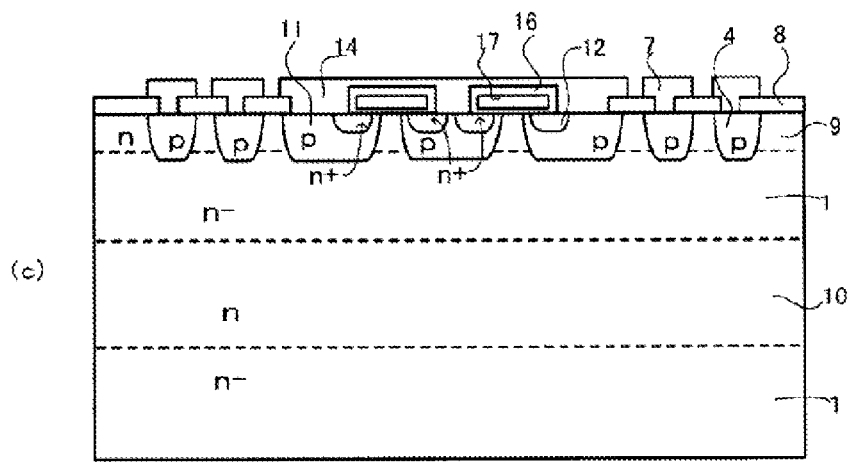

Then, the front surface of the semiconductor substrate 1 is irradiated with $H^+$ and a heat treatment is performed to form the n-type high-concentration surface region 9 in a portion of the surface of the semiconductor substrate 1 other than the p-type region using donors, which are vacancy-oxygen complex defects, and to form the BB region 10 at a deep position in the semiconductor substrate 1 (FIG. 8(c)). In this case, the n-type high-concentration surface region 9 and the BB region 10 may overlap each other or they may be separated from each other. When particle beams, such as electron beams, are used to form the n-type high-concentration surface region 9, particle beams, such as electron beams, may be radiated, instead of $H^+$.

Then, the rear surface of the semiconductor substrate 1 is polished to a predetermined thickness and the collector layer 13 is formed by a process of implanting p-type impurities, such as boron, and an activation process (for example, a heat treatment or laser annealing). Then, the collector electrode 15 is formed on the surface of the collector layer 13. In this way, the IGBT illustrated in FIG. 7(a) is completed. In addition, a known n-type field plate layer (not illustrated) may be formed with an n-type dopant (for example, phosphorus or $H^+$) between the drift layer 1 and the collector layer 13 to prevent a depletion layer from being punched through the collector layer 13.

A method of forming the n-type high-concentration surface region 9 is not limited to the irradiation with $H^+$. The n-type high-concentration surface region 9 may be formed by defects which are formed by the above-mentioned other particle beams such as He or electron beams. In this case, it is possible to obtain the same effect as described above. FIG. 9 illustrates the cross-sectional structure of the IGBT when the n-type high-concentration surface region 9 is formed by particle beams other than $H^+$. FIG. 9 is a diagram illustrating the cross-sectional structure and impurity concentration distribution of another example of the IGBT according to Embodiment 2 of the invention. FIG. 9(a) illustrates the IGBT which does not include the BB region 10 in the drift layer 1 and includes the n-type high-concentration surface region 9. FIG. 9(b) illustrates the impurity concentration distribution taken along the cut line B-B' of FIG. 9(a). FIG. 9(c) illustrates the impurity concentration distribution taken along the cut line A-A' of FIG. 9(a). The IGBT illustrated in FIG. 9 differs from the IGBT illustrated in FIG. 7 in that it does not include the BB region 10. Irradiation with particle beams for forming the n-type high-concentration surface region 9 may be performed at the same time as irradiation with particle beams for forming a lifetime killer in the IGBT. In this case, it is possible to obtain the same effect as that in the related art, without increasing the number of processes.

Figure 10:
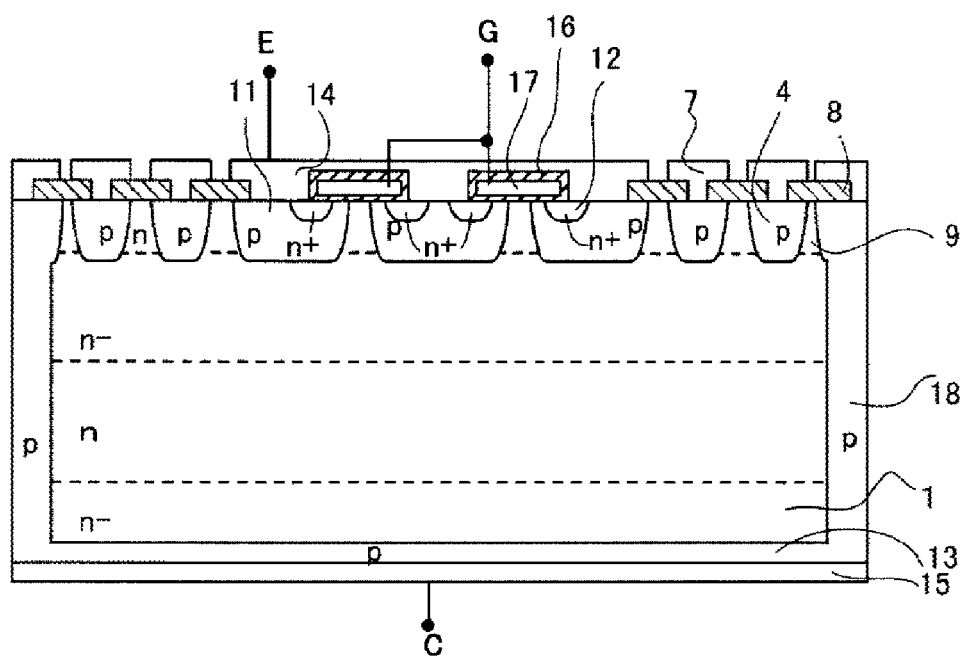
FIG. 10 is a cross-sectional view illustrating the structure of a reverse blocking IGBT according to Embodiment 2 of the invention.
Figure 11A:
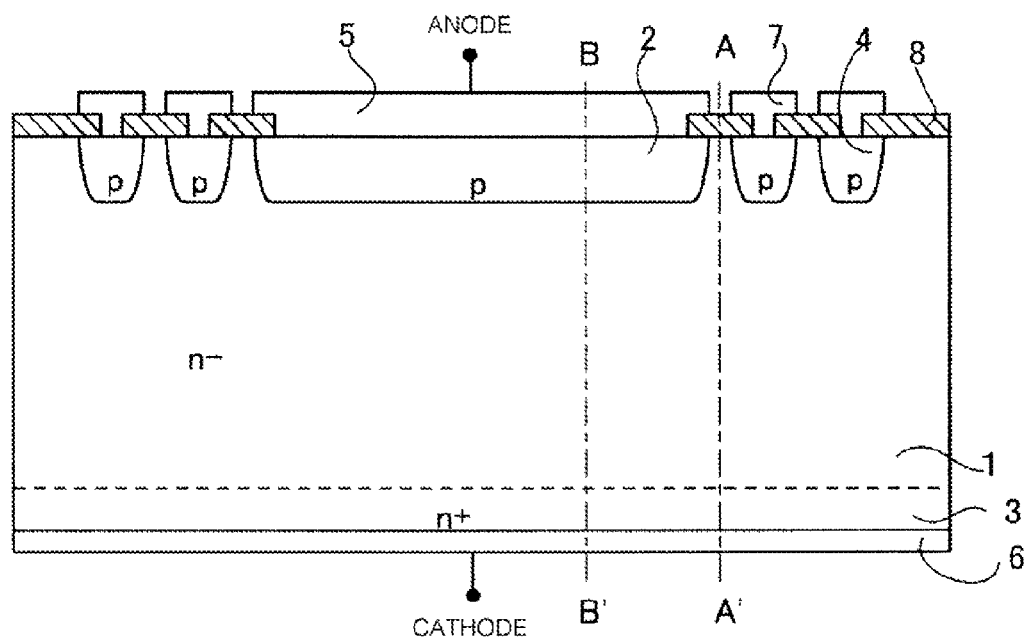
FIG. 11 is a diagram illustrating the uniform impurity concentration distribution of a general diode according to the related art.
Figures 11B, 11C:
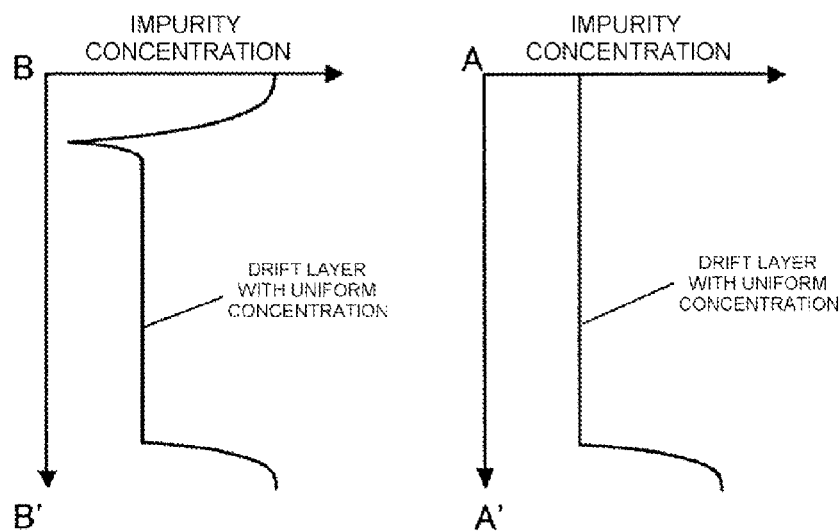
Figure 12A:
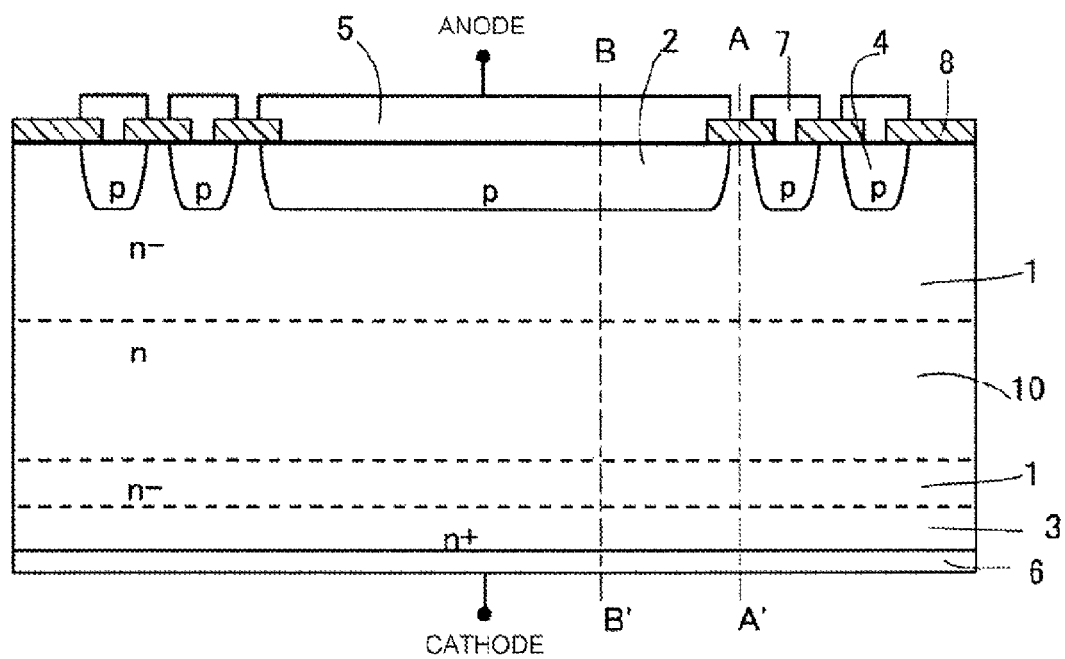
FIG. 12 is a diagram illustrating the impurity concentration distribution of a diode with a broad buffer structure according to the invention.
Figures 12B, 12C:
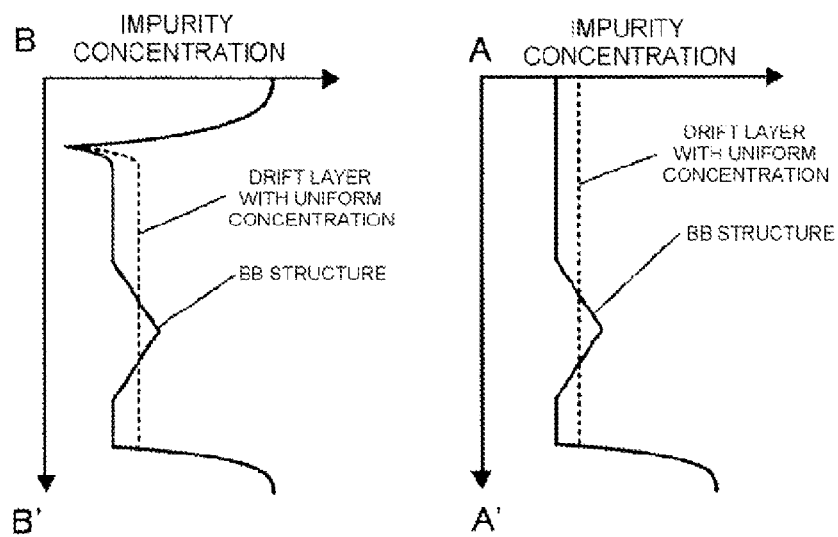

FIGS. 7 and 9 illustrate a planar gate IGBT. However, a trench gate IGBT may be provided. In addition, as illustrated in the cross-sectional view of FIG. 10, the same effect as described above can be obtained in a reverse blocking IGBT, in addition to the general IGBT. FIG. 10 is a cross-sectional view illustrating the structure of a reverse blocking IGBT according to Embodiment 2 of the invention. Among reference numerals in the reverse blocking IGBT illustrated in FIG. 10, reference numeral 18 is a p-type separation layer. The structure of the reverse blocking IGBT illustrated in FIG. 10 is the same as that of the IGBT illustrated in FIG. 7 except for the p-type separation layer 18. The p-type separation layer 18 has a function of bending the end of the pn junction between the collector layer 13 and the drift layer 1 to the surface of the semiconductor substrate 1. Since the end surface of the pn junction is protected by the insulating film 8, it is possible to effectively maintain a reverse voltage.

In the IGBT according to Embodiment 2, for the same reason as that described in the diode according to Embodiment 1, it is preferable that, in the semiconductor substrate 1, particularly, in a section corresponding to the range Rp of each particle beam from the surface of the emitter layer 12 to the position of the maximum value of impurity concentration of the BB region 10, the thickness of a region with an oxygen concentration equal to or more than $1\times10^{16}/cm^3$ and equal to or less than $1\times10^{18}/cm^3$ in the semiconductor substrate 1 be equal to or more than half the thickness of the section and oxygen concentration at one of the position of the maximum values of impurity concentration of the broad buffer region be equal to or more than $1\times10^{16}/cm^3$ and equal to or less than $1\times10^{18}/cm^3$.

As described above, according to the semiconductor device of Embodiment 2, similarly to the semiconductor device according to Embodiment 1, it is possible to increase the impurity concentration of the n-type high-concentration surface region which is formed to a depth of 5 μm from the surface of a termination breakdown voltage region to be higher than the impurity concentration of the semiconductor substrate, while reducing the impurity concentration of the semiconductor substrate. As a result, it is possible to improve resistance to external charge and the equipotential lines of the depletion layer which extends from the pn junction when a reverse bias is applied to the pn junction between the p-type base layer and the n-type drift layer are densely arranged in the n-type high-concentration surface region and are prevented from being spread. Therefore, it is possible to reduce the size of an element. In addition, since the defect caused by irradiation with particle beams can be used as a recombination center, it is possible to reduce a lifetime in the vicinity of the termination breakdown voltage region. In this way, it is possible to prevent the concentration of carriers on the termination breakdown voltage region when power is supplied and during reverse recovery. In the structure of the semiconductor device according to Embodiment 2, the n-type high-concentration surface region and the BB region (or only the n-type high-concentration surface region) can be formed by irradiation with particle beams and a heat treatment process when a lifetime killer is formed. Therefore, it is possible to form a semiconductor device using a simple method with a small number of processes. In addition, since the broad buffer region with high impurity concentration is provided in the drift layer, an IGBT with a high speed, low loss, and soft switching characteristics is obtained.

In each of the above-described embodiments of the invention, the first conduction type is an n type and the second conduction type is a p type. However, in the invention, the first conduction type may be a P type and the second conduction type may be an n type. In this case, the same effect as described above is obtained.

INDUSTRIAL APPLICABILITY

As described above, the semiconductor device and the method of manufacturing the same according to the invention are particularly useful for a power semiconductor device such as a diode or an IGBT.

The invention claimed is:
1. A semiconductor device comprising:
   a semiconductor substrate of a first conduction type;
   a second-conduction-type semiconductor region, the second-conduction-type semiconductor region being selectively formed in a surface layer of one main surface of the semiconductor substrate in an active portion in which a main current flows;
   an annular second-conduction-type breakdown voltage structure region, the annular second-conduction-type breakdown voltage structure region being selectively formed in the surface layer of the one main surface of the semiconductor substrate in an annular termination breakdown voltage region that surrounds the outer circumference of the second-conduction-type semiconductor region; and
   a first-conduction-type high-concentration surface region including H$^+$ and that occupies a region of the surface layer of the one main surface of the semiconductor substrate other than a region in which the second-conduction-type breakdown voltage structure region is formed, in the termination breakdown voltage region;
   wherein an impurity concentration of the first-conduction-type high-concentration surface region is higher than an impurity concentration of the semiconductor substrate and is lower than an impurity concentration of the second-conduction-type semiconductor region;
   wherein the depth of the first-conduction-type high-concentration surface region is less than the depth of the second-conduction-type breakdown voltage structure region; and
   wherein the first-conduction-type high-concentration surface region includes an oxygen concentration in a range as follows:
   $1\times10^{16}/cm^3 <$ the oxygen concentration of the first-conduction-type high-concentration surface region $\leq 1\times10^{18}/cm^3$.

2. The semiconductor device according to claim 1, wherein the impurity concentration of the first-conduction-type high-concentration surface region is in a range as follows:
   1.5 times the impurity concentration of the semiconductor substrate$\leq$the impurity concentration of the first-conduction-type high-concentration surface region$\leq$4.5 times the impurity concentration of the semiconductor substrate.

3. The semiconductor device according to claim 1, further comprising a first-conduction-type broad buffer region that is provided in the semiconductor substrate, has an impurity concentration higher than the semiconductor substrate, and has a sloped impurity concentration distribution in which the impurity concentration is reduced from a portion with maximum impurity concentration in a depth direction of the semiconductor substrate to both main surfaces of the semiconductor substrate.

4. A method of forming the semiconductor device according to claim 3, comprising:
   performing a heat treatment at a temperature of 1100° C. to 1350° C. in an oxygen atmosphere for 5 hours to 100 hours;
   performing impurity ion implantation and thermal diffusion to form the second-conduction-type semiconductor region and the annular termination breakdown voltage region that surrounds the outer circumference of the second-conduction-type semiconductor region in the surface layer of the semiconductor substrate;

setting the oxygen concentration of the semiconductor substrate to be equal to or more than $1\times10^{16}/cm^3$ and equal to or less than $1\times10^{18}/cm^3$; and irradiating the surface of the semiconductor substrate in which the second-conduction-type semiconductor region is formed with protons with a dose equal to or more than $1\times10^{11}/cm^2$ and equal to or less than $1\times10^{14}/cm^2$ at an acceleration energy equal to or more than 1.0 MeV and equal to or less than 20.0 MeV to form the first-conduction-type broad buffer region in which a portion with maximum impurity concentration is provided at a depth corresponding to a range and the first-conduction-type high-concentration surface region, after performing the heat treatment, performing impurity ion implantation and thermal diffusion, and setting the oxygen concentration.

5. The method according to claim 4, wherein performing the heat treatment is performed such that, in a section from the surface of the second-conduction-type semiconductor region to the portion with the maximum impurity concentration in the first-conduction-type broad buffer region, the thickness of a region with an oxygen concentration equal to or more than $1\times10^{16}/cm^3$ and equal to or less than $1\times10^{18}/cm^3$ in the semiconductor substrate is equal to or more than half the thickness of the section and the oxygen concentration of one of the portions with the maximum impurity concentration in the first-conduction-type broad buffer region is equal to or more than $1\times10^{16}/cm^3$ and equal to or less than $1\times10^{18}/cm^3$.

6. The semiconductor device according to claim 1, wherein the thickness of the first-conduction-type high-concentration surface region is equal to or less than 6 μm.

7. The semiconductor device according to claim 1, wherein the semiconductor device is a diode or an IGBT.

8. A method of forming the semiconductor device according to claim 1, comprising:

performing a heat treatment at a temperature of 1100° C. to 1350° C. in an oxygen atmosphere for 5 hours to 100 hours;

performing impurity ion implantation and thermal diffusion to form the second-conduction-type semiconductor region and the annular termination breakdown voltage region that surrounds the outer circumference of the second-conduction-type semiconductor region in the surface layer of the semiconductor substrate;

setting the oxygen concentration of the semiconductor substrate to be equal to or more than $1\times10^{16}/cm^3$ and equal to or less than $1\times10^{18}/cm^3$; and irradiating the surface of the semiconductor substrate in which the second-conduction-type semiconductor region is formed with particle beams, which are one of helium ions, neon ions, argon ions, electron beams, and platinum ions, to form the first-conduction-type high-concentration surface region after performing the heat treatment, performing impurity ion implantation and thermal diffusion, and setting the oxygen concentration.

9. The semiconductor device according to claim 1, wherein the semiconductor substrate includes an oxygen concentration in a range as follows:

$1\times10^{16}/cm^3 \leq$ the oxygen concentration of the semiconductor substrate $\leq 1\times10^{18}/cm^3$.

10. A semiconductor device comprising:
a semiconductor substrate of a first conduction type;
a second-conduction-type semiconductor region, the second-conduction-type semiconductor region being selectively formed in a surface layer of one main surface of the semiconductor substrate in an active portion in which a main current flows;

an annular second-conduction-type breakdown voltage structure region, the annular second-conduction-type breakdown voltage structure region being selectively formed in the surface layer of the one main surface of the semiconductor substrate in an annular termination breakdown voltage region that surrounds the outer circumference of the second-conduction-type semiconductor region; and a first-conduction-type high-concentration surface region that occupies a region of the surface layer of the one main surface of the semiconductor substrate other than a region in which the second-conduction-type breakdown voltage structure region is formed, in the termination breakdown voltage region;

wherein an impurity concentration of the first-conduction-type high-concentration surface region is higher than an impurity concentration of the semiconductor substrate and is lower than an impurity concentration of the second-conduction-type semiconductor region;

wherein the depth of the first-conduction-type high-concentration surface region is less than the depth of the second-conduction-type breakdown voltage structure region; and wherein the first-conduction-type high-concentration surface region includes a donor which is a vacancy-oxygen complex defect.

11. A semiconductor device comprising:
a semiconductor substrate of a first conduction type;
a second-conduction-type semiconductor region, the second-conduction-type semiconductor region being selectively formed in a surface layer of one main surface of the semiconductor substrate in an active portion in which a main current flows;

an annular second-conduction-type breakdown voltage structure region, the annular second-conduction-type breakdown voltage structure region being selectively formed in the surface layer of the one main surface of the semiconductor substrate in an annular termination breakdown voltage region that surrounds the outer circumference of the second-conduction-type semiconductor region; and a first-conduction-type high-concentration surface region that occupies a region of the surface layer of the one main surface of the semiconductor substrate other than a region in which the second-conduction-type breakdown voltage structure region is formed, in the termination breakdown voltage region; and a first-conduction-type broad buffer region including a hydrogen donor and that is provided in the semiconductor substrate, has an impurity concentration higher than the semiconductor substrate, and has a sloped impurity concentration distribution in which the impurity concentration is reduced from a portion with maximum impurity concentration in a depth direction of the semiconductor substrate to both main surfaces of the semiconductor substrate, wherein an impurity concentration of the first-conduction-type high-concentration surface region is higher than an impurity concentration of the semiconductor substrate and is lower than an impurity concentration of the second-conduction-type semiconductor region, wherein the depth of the first-conduction-type high-concentration surface region is less than the depth of the second-conduction-type breakdown voltage structure region, and wherein the first-conduction-type high-concentration surface region includes an oxygen concentration in a range as follows:

$1\times10^{16}/cm^3 <$ the oxygen concentration of the first-conduction-type high-concentration surface region $\leq 1\times 10^{18}/cm^3$.

12. The semiconductor device according to claim 11, wherein the first-conduction-type high-concentration surface region includes $H^+$.

* * * * *